United States Patent
Kim et al.

(10) Patent No.: US 10,147,869 B2
(45) Date of Patent: Dec. 4, 2018

(54) FLEXIBLE PIEZOELECTRIC COMPOSITE AND PIEZOELECTRIC DEVICE INCLUDING THE SAME

(71) Applicant: ELECTRONICS AND TELECOMMUNICATIONS RESEARCH INSTITUTE, Daejeon (KR)

(72) Inventors: Hye Jin Kim, Daejeon (KR); Bora Yeon, Cheongju (KR)

(73) Assignee: ELECTRONICS AND TELECOMMUNICATIONS RESEARCH INSTITUTE, Daejeon (KR)

(*) Notice: Subject to any disclaimer, the term of this patent is extended or adjusted under 35 U.S.C. 154(b) by 252 days.

(21) Appl. No.: 15/240,947

(22) Filed: Aug. 18, 2016

(65) Prior Publication Data

US 2017/0263848 A1    Sep. 14, 2017

(30) Foreign Application Priority Data

Mar. 11, 2016  (KR) .................. 10-2016-0029711

(51) Int. Cl.
   *H01L 41/09*   (2006.01)
   *H01L 41/193*  (2006.01)
   *H01L 41/047*  (2006.01)

(52) U.S. Cl.
   CPC ........ *H01L 41/193* (2013.01); *H01L 41/0471* (2013.01)

(58) Field of Classification Search
   CPC ..................... H01L 41/193; H01L 41/0471
   USPC ........................................... 310/328
   See application file for complete search history.

(56) References Cited

U.S. PATENT DOCUMENTS

| | | | |
|---|---|---|---|
| 8,279,712 B2 | 10/2012 | Korbler et al. | |
| 8,771,541 B2 | 7/2014 | Miyoshi et al. | |
| 9,105,844 B2 | 8/2015 | Kim et al. | |
| 2011/0074249 A1 | 3/2011 | Sakashita et al. | |
| 2012/0148073 A1 | 6/2012 | Kim et al. | |
| 2013/0256581 A1 | 10/2013 | Miyoshi et al. | |
| 2013/0301856 A1 | 11/2013 | Kim et al. | |

FOREIGN PATENT DOCUMENTS

| | | |
|---|---|---|
| JP | 5616171 B2 | 10/2014 |
| KR | 10-0070023 B1 | 9/1993 |
| KR | 10-0707949 B1 | 4/2007 |
| KR | 10-0795192 B1 | 1/2008 |
| KR | 10-0824745 B1 | 4/2008 |
| KR | 10-0887337 B1 | 3/2009 |
| KR | 10-2013-0024224 A | 3/2013 |
| KR | 10-2014-0009253 A | 1/2014 |
| KR | 10-1386008 B1 | 4/2014 |
| KR | 10-1442632 B1 | 9/2014 |
| KR | 10-2016-0005958 A | 1/2016 |

*Primary Examiner* — Thomas Dougherty

(57) ABSTRACT

Provided is a flexible piezoelectric composite. The flexible piezoelectric composite includes a matrix having first and second polymers, wherein Young's modulus of the first polymer and Young's modulus of the second polymer are different from each other; and a conductive nanostructure disposed in the matrix. In addition, a piezoelectric device including the flexible piezoelectric composite is provided.

8 Claims, 12 Drawing Sheets

FLEXIBLE PIEZOELECTRIC COMPOSITE AND PIEZOELECTRIC DEVICE INCLUDING THE SAME

CROSS-REFERENCE TO RELATED APPLICATION

This U.S. non-provisional patent application claims priority under 35 U.S.C. § 119 of Korean Patent Application No. 10-2016-0029711, filed on Mar. 11, 2016, the entire contents of which are hereby incorporated by reference.

BACKGROUND

The present disclosure herein relates to a piezoelectric composite and a piezoelectric device including the same, and more particularly, to a flexible piezoelectric composite and a piezoelectric device including the same.

When a mechanical displacement is applied to a piezoelectric material, a voltage is generated (piezoelectric effect), and when a voltage is applied, a mechanical displacement is generated (inverse piezoelectric effect). Such a device that uses a piezoelectric material is referred to as a piezoelectric device. Piezoelectric devices using piezoelectric effect are being used in pressure sensors, force sensors, energy harvest elements or the like, and piezoelectric devices using inverse piezoelectric effects are being used in speakers, haptic elements, actuators or the like.

Typical piezoelectric materials include ferroelectrics having a Perovskite structure, such as, PZT, $BaTiO_3$, or PMN-PT. Since being manufactured through single crystal growth or a sintering process, such piezoelectric materials have drawbacks of being hard and easily broken.

Recently, as the demands for flexible electronic devices are increased, research on flexible piezoelectric composite replacing existing hard and easily-broken piezoelectric materials has been actively carried out.

SUMMARY

The present disclosure provides a display device having enhanced displaying quality and a reduced volume.

The present disclosure provides a flexible piezoelectric composite.

The present disclosure also provides a piezoelectric device having an improved driving force.

The object of the inventive concept is not limited to the aforesaid, but other objects not described herein will be clearly understood by those skilled in the art from descriptions below.

An embodiment of the inventive concept provides a flexible piezoelectric composite including a matrix having first and second polymers which have Young's moduli different from each other; piezoelectric particles disposed in the matrix; and a conductive nanostructure disposed in the matrix.

In an embodiment, the Young's modulus of the first polymer may be equal to or greater than about 10 times the Young's modulus of the second polymer.

In an embodiment, the first polymer may be a bisphenol-F epoxy, and the second polymer is a bisphenol-A epoxy.

In an embodiment, the conductive nanostructure may have a bar shape having a longitudinal axis in one direction.

In an embodiment, the conductive nanostructure may include carbon nanotubes, and the content of the conductive nanostructure may be about 0.1 wt % or less.

In an embodiment, the content of the conductive nanostructure may be about 0.03 wt % to about 0.08 wt %.

In an embodiment, a content of the piezoelectric particles may be about 50 wt % to about 90 wt %.

In an embodiment of the inventive concept, a piezoelectric device includes: a flexible piezoelectric composite including first to third polarization regions which are arranged in a horizontal direction, the second polarization region being located between the first and third polarization regions; first to third electrodes disposed on an upper surface of the flexible piezoelectric composite, the first electrode vertically overlapping the first polarization region, the second electrode vertically overlapping the second polarization region, and the third electrode vertically overlapping the third polarization region; and fourth to sixth electrodes disposed on a lower surface of the flexible piezoelectric composite, the fourth electrode vertically overlapping the first polarization region, the fifth electrode vertically overlapping the second polarization region, and the sixth electrode vertically overlapping the third polarization region. The first to third polarization regions each may have a vertical polarization.

In an embodiment, the polarization direction of the first polarization region and the polarization direction of the third polarization region may be the same as each other. The polarization direction of the second polarization region and the polarization direction of the first polarization region may be opposite to each other.

In an embodiment, a first driving alternating current (AC) voltage may be applied to the first to third electrodes. A second driving AC voltage may be applied to the fourth to sixth electrodes. The first driving AC voltage and the second driving AC voltage may have the same period but have opposite phases.

In an embodiment, the polarization directions of the first to third polarization regions may be the same as each other.

In an embodiment, a first driving AC voltage may be applied to the first, third, and fifth electrodes. A second driving AC voltage may be applied to the second, fourth and sixth electrodes. The first and second AC voltages may have the same period but have opposite phases.

In an embodiment of the inventive concept, a piezoelectric device includes: a flexible piezoelectric composite including first to fifth polarization regions which are sequentially arranged in a horizontal direction; a pair of first electrodes disposed on an upper surface of the flexible piezoelectric composite, any one of the first electrodes vertically overlapping a border between the first and second polarization regions, the remaining one of the first electrodes vertically overlapping a border between the fourth and fifth polarization regions; second electrodes disposed on the upper surface of the flexible piezoelectric composite; a third electrode disposed on a lower surface of the flexible piezoelectric composite and vertically overlapping the third polarization region; and a fourth electrode disposed on the upper surface of the flexible piezoelectric composite and vertically overlapping the third polarization region. Any one pair of the second electrodes may be respectively disposed at both end portions of the flexible piezoelectric composite. The remaining one pair of the second electrodes may be respectively disposed between the fourth electrode and the any one the first electrodes and between the fourth electrode and the remaining one of the first electrodes.

In an embodiment, each of the first, second, fourth, and fifth polarization regions may have a horizontal polarization, and the third polarization region may have a vertical polarization.

In an embodiment, a polarization direction of the first polarization region and a polarization direction of the fourth polarization region may be the same as each other, and a polarization direction of the second polarization region and a polarization direction of the fifth polarization region may be the same as each other.

In an embodiment, a first driving alternating current (AC) voltage may be applied to the first electrodes. A second driving AC voltage may be applied to the second electrodes. The first and second driving AC voltages may have the same period but have opposite phases.

In an embodiment, a third driving AC voltage may be applied to the third electrode. A fourth driving AC voltage may be applied to the fourth electrodes. The third and fourth driving AC voltages may have the same period but have opposite phases.

In an embodiment, the piezoelectric device may further include an additional flexible piezoelectric composite disposed on the fourth electrode; and an additional third electrode disposed on an upper surface of the additional flexible piezoelectric composite.

In an embodiment, the additional flexible piezoelectric composite may have a vertical polarization.

Particularities of other embodiments are included in the detailed description and drawings.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Figure 1:
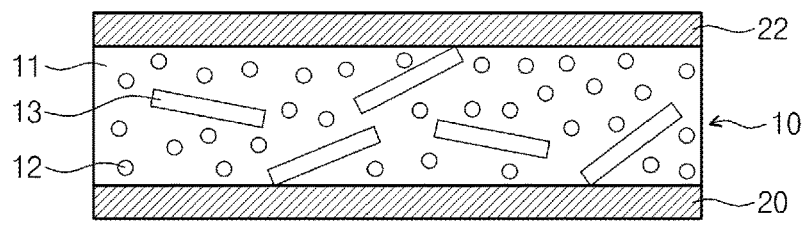
FIG. 1 is a cross-sectional view illustrating a flexible piezoelectric composite according to embodiments of the inventive concept.

Advantages and features of the inventive concept, and implementation methods thereof will be clarified through following embodiments described with reference to the accompanying drawings. The present invention may, however, be embodied in different forms and should not be construed as limited to the embodiments set forth herein. Rather, these embodiments are provided so that this disclosure will be thorough and complete, and will fully convey the scope of the inventive concept to those skilled in the art. Further, the present invention is only defined by scopes of claims. Like reference numerals refer to like elements throughout.

In the following description, the technical terms are used only for explaining a specific exemplary embodiment while not limiting the inventive concept. The terms of a singular form may include plural forms unless specifically mentioned. The meaning of 'comprises' and/or 'comprising' specifies a property, a region, a fixed number, a step, a process, an element and/or a component but does not exclude other properties, regions, fixed numbers, steps, processes, elements and/or components.

Additionally, the embodiment in the detailed description will be described with sectional views as ideal exemplary views of the inventive concept. In the figures, the dimensions of layers and regions are exaggerated for clarity of illustration. Accordingly, shapes of the exemplary views may be modified according to manufacturing techniques and/or allowable errors. Therefore, the embodiments of the inventive concept are not limited to the specific shape illustrated in the exemplary views, but may include other shapes that may be created according to manufacturing processes. For example, an etched region illustrated as a rectangle may have rounded or curved features. Areas exemplified in the drawings have general properties, and are used to illustrate a specific shape of a semiconductor package region. Thus, this should not be construed as limited to the scope of the inventive concept.

Figure 2:
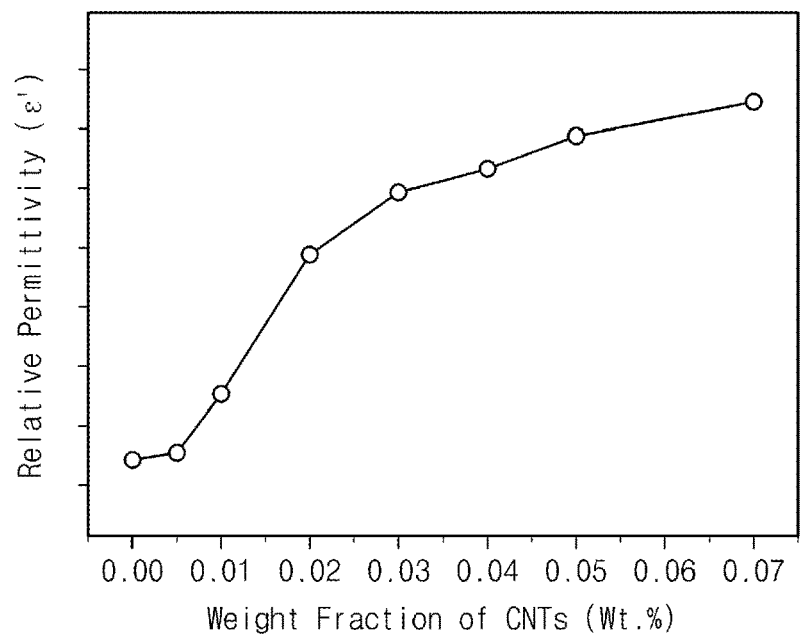
FIG. 2 is a graph illustrating permittivity of a flexible piezoelectric composite according to the content of conductive nanostructure (carbon nanotubes) contained in a flexible piezoelectric composite.

FIG. 1 is a cross-sectional view illustrating a flexible piezoelectric composite according to embodiments of the inventive concept. FIG. 2 is a graph illustrating permittivity of a flexible piezoelectric composite according to the content of conductive nanostructures (carbon nanotubes) contained in a flexible piezoelectric composite.

Referring to FIG. 1, a flexible piezoelectric composite 10 may include a polymer matrix 11, piezoelectric particles 12, and conductive nanostructures 13.

The polymer matrix 11 may include a first polymer and a second polymer. Young's modulus of the first polymer may differ from that of the second polymer. Specifically, the Young's modulus of the first polymer may be equal to or greater than about 10 times the Young's modulus of the second polymer. The first and second polymers may be selected from, for example, epoxy, silicone rubber, polymethylmethacrylate (PMMA), polyurethane, polydimethyl siloxane (PDMS), polyvinylidenefluoride (PVDF), or poly (vinylidenefluoride-co-trifluoroethylene (P(VDF-TrFE)). According to an embodiment, the first polymer may be a bisphenol-F epoxy, and the second polymer may be a bisphenol-A epoxy, and in this case, the Young's modulus of the first polymer may be about 300 times to about 500 times the Young's modulus of the second polymer.

Piezoelectric particles 12 may have piezoelectricity and may be disposed to be dispersed in the polymer matrix 11. For example, the size (for example, the diameter) of each of the piezoelectric particles 12 may be about 0.1 μm to about 2 μm. In another example, the size (for example, the diameter) of each of the piezoelectric particles 12 may be about 0.5 μm to about 1 μm. The piezoelectric particles 12 may include, for example, at least one of PZT, PLZT, PZN-PT, PMN-PT, PIN-PT, PZN-PNN-PZT, BNT, AlN, ZnO, or KNN. The content of piezoelectric particles 12 contained in the flexible piezoelectric composite 10 may be about 50 wt % to about 90 wt % (that is, a weight of about 50% to 90% of the weight of the flexible piezoelectric composite 10). When an external electric field having a sufficient strength is applied to the flexible piezoelectric composite 10, the piezoelectric particles 12 may be polarized.

The conductive nanostructures 13 may have conductivity and may be disposed to be dispersed in the polymer matrix 11. According to several embodiments, each of the conductive nanostructures 13 may have a shape which has a longitudinal axis in one direction. For example, each of the conductive nanostructures 13 may have a bar shape. The conductive nanostructures 13 may include, for example, at least one of carbon nanotubes, graphene, silver nanowires, or metal flakes. The content of the conductive nanostructures 13 contained in the flexible piezoelectric composite 10 may be about 0.01 wt % to about 2 wt % (that is, a weight of about 0.01% to about 2% of the weight of the flexible piezoelectric composite 10). For example, when the conductive nanostructures 13 are carbon nanotubes, the content of the conductive nanostructures 13 may be about 0.01 wt % to about 0.1 wt % (that is, a weight of about 0.01% to about 0.1% of the weight of the flexible piezoelectric composite 10). In another example, when the conductive nanostructures 13 are carbon nanotubes, the content of the conductive nanostructures 13 may be about 0.03 wt % to about 0.08 wt % (that is, a weight of about 0.03% to about 0.08% of the weight of the flexible piezoelectric composite 10). At least some of the conductive nanostructures 13 may be electrically connected to the first electrode 20 or to the second electrode 22 which will be described below.

The first and second electrodes 20 and 22 may be provided on a lower and/or an upper surface of the flexible piezoelectric composite 10. The first and second electrodes 20 and 22 may include a metal such as Ag, Al, Cu, Au, Pt or Al. According to FIG. 1, the first and second electrodes 20 and 22 are respectively provided on the lower surface and the upper surface of the flexible piezoelectric composite 10, but the embodiment of the inventive concept is not limited thereto. For example, unlike FIG. 1, both the first and second electrodes 20 and 22 may be provided on the upper surface of the flexible piezoelectric composite 10, or both the first and second electrodes 20 and 22 may be provided on the lower surface of the flexible piezoelectric composite 10.

According to embodiments of the inventive concept, the flexible piezoelectric composite 10 may include the polymer matrix 11 including first and second polymers which have flexibility different from each other. Accordingly, the flexible piezoelectric composite 10 may have improved flexibility and improved resistant force against inner fatigue fracture.

Also, according to embodiments of the inventive concept, the flexible piezoelectric composite 10 may include the conductive nanostructures 13. Since each of the conductive nanostructures 13 may have a shape having a longitudinal axis in one direction, one end portions of some of the conductive nanostructures 13 may be electrically connected to the first electrode 20 or to the second electrode 22, and the other end portions may face the central portion of the polymer matrix 11. Accordingly, when an external electric field is applied to the flexible piezoelectric composite 10 through the first and second electrodes 20 and 22, even the piezoelectric particles 12 which are positioned relatively farther from the first and second electrodes 20 and 22 (e.g., positioned at the central portion of the polymer matrix 11) may also be effectively polarized by the conductive nanostructures 13 electrically connected to the first electrode 20 or to the second electrode 22. Referring to FIG. 2, when carbon nanotubes are used as the conductive nanostructures 13, the permittivity of the flexible piezoelectric composite 10 according to contents of the carbon nanotubes is illustrated. As can be understood from FIG. 2, the permittivity of the flexible piezoelectric composite 10 may be improved by adding small amount (about 0.1 wt % or less) of carbon nanotubes to the flexible piezoelectric composite 10.

The flexible piezoelectric composite 10 described with reference to FIG. 1 may be manufactured through a method as follows.

First, polymer slurry for a matrix may be manufactured. The polymer slurry for a matrix may be manufactured by mixing a first polymer, a second polymer, a dispersant, and a defoamer.

Subsequently, a piezoelectric paste may be manufactured by adding piezoelectric particles and the conductive nanostructures to the polymer slurry for a matrix. Dispersing the piezoelectric particles and the conductive nanostructures in the piezoelectric paste may be performed.

Subsequently, adding the polymer curing agent in the piezoelectric paste and defoaming may be performed. The piezoelectric paste formed through the above-mentioned steps is coated on a substrate, is then defoamed, and is then cured, and thereby, the flexible piezoelectric composite may be formed.

When an electrode exists on a lower surface of the flexible piezoelectric composite, forming an electrode on the substrate before coating the piezoelectric paste on the substrate may be further performed. When an electrode exists on an upper surface of the flexible piezoelectric composite, after forming the flexible piezoelectric composite on the substrate, forming the electrode on the upper surface of the flexible piezoelectric composite may be further performed After both the flexible piezoelectric composite and the electrodes are formed, the flexible piezoelectric composite may be polarized by applying a sufficient amount of direct current (DC) voltage to the electrodes.

Hereinafter, referring to FIGS. 3A to 3H, 4A, 4B, 5A to 5D, 6, 7, 8A, and 8B, respectively, piezoelectric devices according to embodiments of the inventive concept will be described. In the above-mentioned drawings, a polarization direction of the flexible piezoelectric composite is represented by an arrow. Specifically, the head portion of the arrow may correspond to a positive charge portion of a polarization, and the tail portion of the arrow may correspond to a negative charge portion of a polarization. Furthermore, in the above-mentioned drawings, the symbol (+) or (−) marked on electrodes represents a phase difference of driving alternating current (AC) voltage applied when driving the piezoelectric device. Specifically, the driving AC voltage of the electrode marked as (+) and the driving AC voltage of the electrode marked as (−) may have the same period, but have opposite phases (that is, a phase difference of 180°).

When a voltage is applied to a flexible piezoelectric composite having a polarization, the flexible piezoelectric composite may be deformed. According to the relation between the polarization direction of the flexible piezoelectric composite and the direction of the driving voltage applied to the flexible piezoelectric composite, the direction in which the flexible piezoelectric composite is deformed may become different.

For example, when the polarization direction of the flexible piezoelectric composite and the direction of the driving voltage applied to the flexible piezoelectric composite are the same (that is, when a (−) voltage is applied to the head portion of the arrow representing a polarization, and a (+) voltage is applied to the tail portion of the arrow), the flexible piezoelectric composite may be expanded in the direction parallel to the polarization direction, and contracted in the direction perpendicular to the polarization direction.

On the contrary, when the polarization direction of the flexible piezoelectric composite and the direction of the driving voltage applied to the flexible piezoelectric composite are opposite to each other (that is, when a (+) voltage is applied to the head portion of the arrow representing a polarization, and a (−) voltage is applied to the tail portion of the arrow), the flexible piezoelectric composite may be contracted in the direction parallel to the polarization direction, and expanded in the direction perpendicular to the polarization direction.

Hereinafter, in the following description on the above-mentioned drawings, a vertical direction means the thickness direction of the flexible piezoelectric composite, and a horizontal direction means the direction perpendicular to the thickness direction of the flexible piezoelectric composite.

FIGS. 3A to 3H are cross-sectional views illustrating piezoelectric devices according to embodiments of the inventive concept.

Figure 3A:
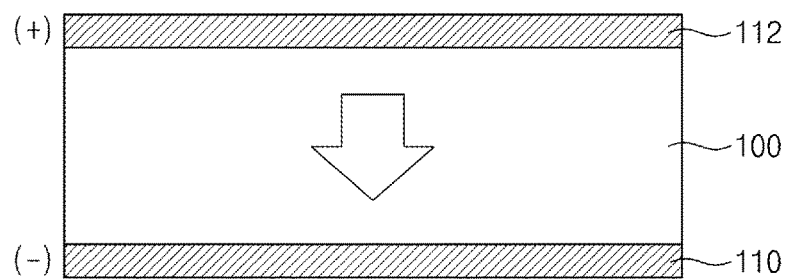
FIGS. 3A to 3H are cross-sectional views illustrating piezoelectric devices according to embodiments of the inventive concept.

Referring to FIG. 3A, a flexible piezoelectric composite 100 may be provided. The flexible piezoelectric composite 100 may be substantially the same as the flexible piezoelectric composite described with reference to FIG. 1. First and second electrodes 110 and 112 may be respectively provided on lower and upper surfaces of the flexible piezoelectric composite 100.

The flexible piezoelectric composite 100 may have a vertical polarization.

When driving the piezoelectric device, a first driving voltage may be applied to the first electrode 110, and a second driving voltage may be applied to the second electrode 112. The first and second driving voltages may be AC voltages which have the same period but have opposite phases.

When the direction of a voltage applied to the flexible piezoelectric composite 100 by the first and second driving voltages is the same as the polarization direction of the flexible piezoelectric composite 100, the flexible piezoelectric composite 100 may be expanded in the vertical direction, and contracted in the horizontal direction. When the direction of a voltage applied to the flexible piezoelectric composite 100 by the first and second driving voltages is opposite the polarization direction of the flexible piezoelectric composite 100, the flexible piezoelectric composite 100 may be contracted in the vertical direction, and expanded in the horizontal direction. Accordingly, when driving the piezoelectric device, the flexible piezoelectric composite 100 may repeat the contraction and expansion in the vertical and horizontal directions.

Figure 3B:
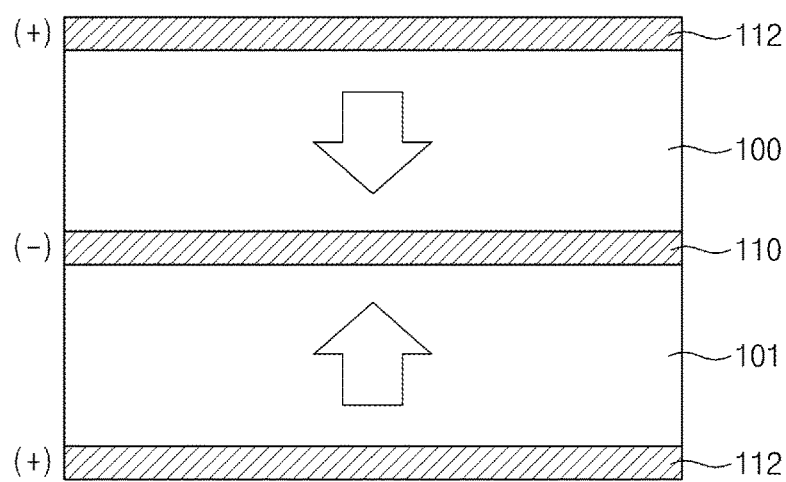

Referring to FIG. 3B, first and second flexible piezoelectric composites 100 and 101 may be provided. The first flexible piezoelectric composite 100 may be disposed on the second flexible piezoelectric composite 101. Each of the first and second flexible piezoelectric composites 100 and 101 may be substantially the same as the flexible piezoelectric composite described with reference to FIG. 1. A first electrode 110 may be interposed between the first and second flexible piezoelectric composites 100 and 101. Second electrodes 112 may be disposed on the upper surface of the first flexible piezoelectric composite 100 and on the lower surface of the second flexible piezoelectric composite 101.

Each of the first and second flexible piezoelectric composites 100 and 101 may have a vertical polarization. Specifically, the polarization directions of the first flexible piezoelectric composite 100 and the second flexible piezoelectric composite 101 may be opposite to each other.

When driving the piezoelectric device, a first driving voltage may be applied to the first electrode 110, and a second driving voltage may be applied to the second electrodes 112. The first and second driving voltages may be AC voltages which have the same period but have opposite phases.

When driving the piezoelectric device, the relation between the polarization direction of the first flexible piezoelectric composite 100 and the direction of the voltage applied to the first flexible piezoelectric composite 100 may be the same as the relation between the polarization direction of the second flexible piezoelectric composite 101 and the direction of the voltage applied to the second flexible piezoelectric composite 101. Accordingly, when driving the piezoelectric device, the deformation direction of the first flexible piezoelectric composite 100 and the deformation direction of the second flexible piezoelectric composite 101 may be the same. Specifically, when the first flexible piezoelectric composite 100 is expanded in the vertical direction and contracted in the horizontal direction, the second flexible piezoelectric composite 101 may be expanded in the vertical direction and contracted in the horizontal direction.

Figure 3C:
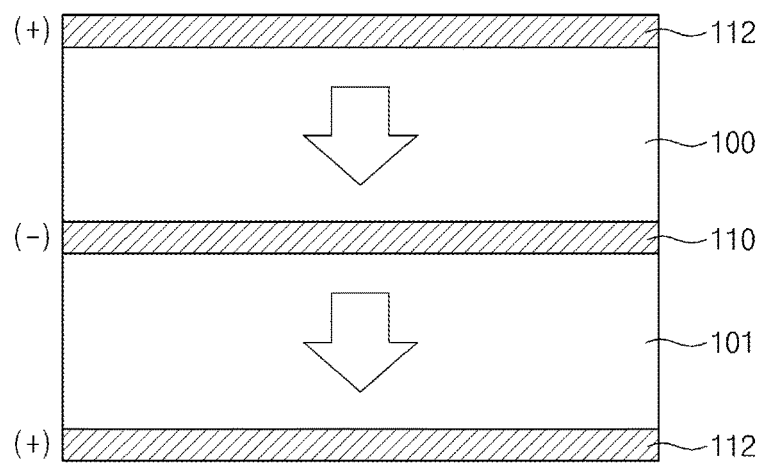

Referring to FIG. 3C, first and second flexible piezoelectric composites 100 and 101, a first electrode 110, and second electrodes 112 which are disposed the same as FIG. 3B may be provided.

Each of the first and second flexible piezoelectric composites 100 and 101 may have a vertical polarization. Specifically, unlike FIG. 3B, the polarization directions of the first flexible piezoelectric composite 100 and the second flexible piezoelectric composite 101 may be the same.

When driving the piezoelectric device, a first driving voltage may be applied to the first electrode 110, and a second driving voltage may be applied to the second electrodes 112. The first and second driving voltages may be AC voltages which have the same period but have opposite phases.

When driving the piezoelectric device, the relation between the polarization direction of the first flexible piezoelectric composite 100 and the direction of the voltage applied to the first flexible piezoelectric composite 100 may be opposite the relation between the polarization direction of the second flexible piezoelectric composite 101 and the direction of the voltage applied to the second flexible piezoelectric composite 101. Accordingly, when driving the piezoelectric device, the deformation direction of the first flexible piezoelectric composite 100 and the deformation direction of the second flexible piezoelectric composite 101 may be opposite to each other. Specifically, when the first flexible piezoelectric composite 100 is expanded in the vertical direction and contracted in the horizontal direction, the second flexible piezoelectric composite 101 may be contracted in the vertical direction and expanded in the horizontal direction. On the contrary, when the first flexible piezoelectric composite 100 is contracted in the vertical direction and expanded in the horizontal direction, the second flexible piezoelectric composite 101 may be expanded in the vertical direction and contracted in the horizontal direction. Consequently, when driving the piezoelectric device, the piezoelectric device may be curvedly deformed in the vertical direction.

Figure 3D:
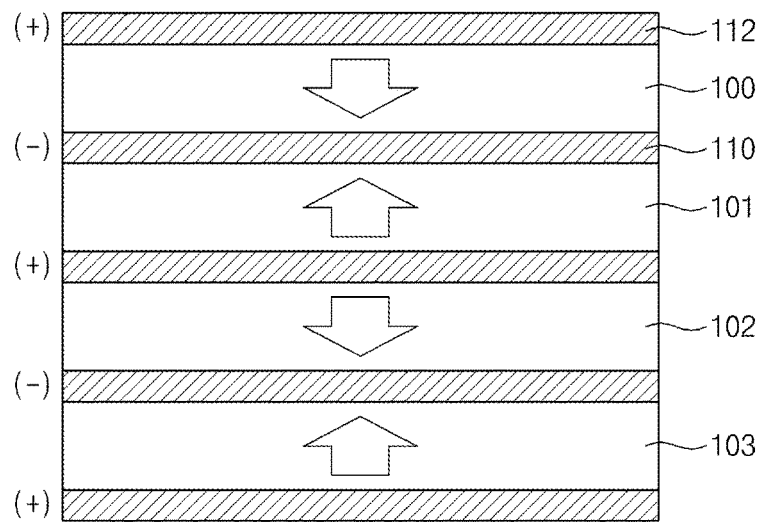

Referring to FIG. 3D, first to fourth flexible piezoelectric composites 100, 101, 102, and 103 may be provided. The first to fourth flexible piezoelectric composites 100, 101, 102, and 103 may be sequentially disposed in the vertical direction. Each of the first to fourth flexible piezoelectric composites 100, 101, 102, and 103 may be substantially the same as the flexible piezoelectric composite described with reference to FIG. 1. First and second electrodes 110 and 112 may be provided. The first electrodes 110 may be respectively disposed between the first and second flexible piezoelectric composites 100 and 101, and between the third and fourth flexible piezoelectric composites 102 and 103. The second electrodes 112 may be respectively disposed on the upper surface of the first flexible piezoelectric composite 100, between the second and third flexible piezoelectric composites 101 and 102, and on the lower surface of the fourth flexible piezoelectric composite 103.

Each of the first to fourth flexible piezoelectric composites 100, 101, 102, and 103 may respectively have a vertical polarization. Specifically, the polarization directions of the first flexible piezoelectric composite 100 and the second flexible piezoelectric composite 101 may be opposite to each other. The polarization direction of the third flexible piezoelectric composite 102 may be the same as that of the first flexible piezoelectric composite 100, and the polarization directions of the fourth flexible piezoelectric composite 103 may be the same as the second flexible piezoelectric composite 101.

When driving the piezoelectric device, a first driving voltage may be applied to the first electrodes 110, and a second driving voltage may be applied to the second electrodes 112. The first and second driving voltages may be AC voltages which have the same period but have opposite phases.

When driving the piezoelectric device, the relations between the polarization directions and voltage directions of the first to fourth flexible piezoelectric composites 100, 101, 102, and 103 may be the same as each other. Thus, as described with reference to FIG. 3B, when driving the piezoelectric device, the deformation directions of the first to fourth flexible piezoelectric composites 100, 101, 102, and 103 may be the same as each other.

Figure 3E:
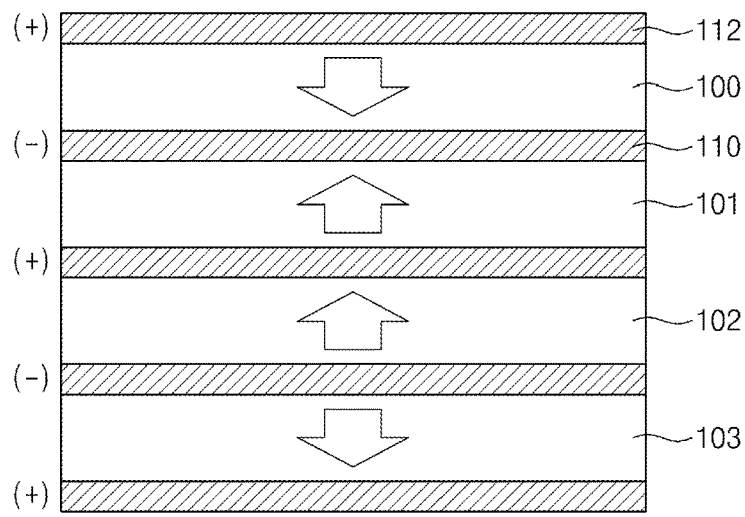

Referring to FIG. 3E, first to fourth flexible piezoelectric composites 100, 101, 102, and 103, first electrodes 110, and second electrodes 112 which are disposed the same as FIG. 3D may be provided.

Each of the first to fourth flexible piezoelectric composites 100, 101, 102, and 103 may have a vertical polarization. Specifically, the polarization directions of the first flexible piezoelectric composite 100 and the second flexible piezoelectric composite 101 may be opposite to each other. The polarization directions of the third flexible piezoelectric composite 102 may be the same as that of the second flexible piezoelectric composite 101, and the polarization directions of the fourth flexible piezoelectric composite 103 may be the same as that of the first flexible piezoelectric composite 100.

When driving the piezoelectric device, a first driving voltage may be applied to the first electrodes 110, and a second driving voltage may be applied to the second electrodes 112. The first and second driving voltages may be AC voltages which have the same period but have opposite phases.

When driving the piezoelectric device, the relations between the polarization directions and voltage directions of the first and second flexible piezoelectric composites 100 and 101 may be the same as each other, and the relations between the polarization directions and voltage directions of the third and fourth flexible piezoelectric composites 102 and 103 may be the same as each other. The relation between the polarization directions and voltage directions of the first flexible piezoelectric composite 100 and the relation between the polarization directions and voltage directions of the third flexible piezoelectric composite 102 may be opposite to each other. Accordingly, as described with reference to FIG. 3C, the deformation directions of the first and second flexible piezoelectric composites 100 and 101 and the deformation directions of the third and fourth flexible piezoelectric composites 102 and 103 may be opposite to each other.

Figure 3F:
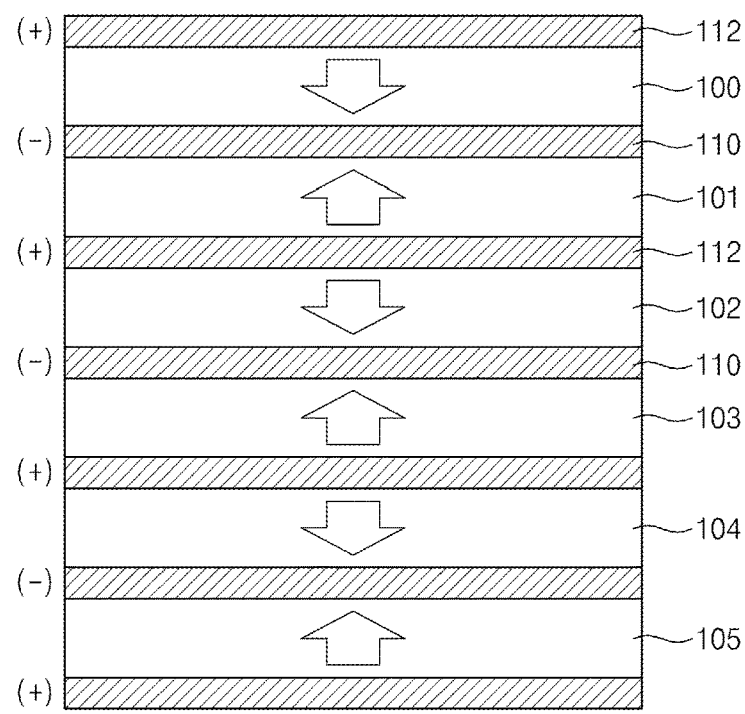

Referring to FIG. 3F, first to sixth flexible piezoelectric composites 100, 101, 102, 103, 104, and 105, first electrodes 110, and second electrodes 112 may be provided. The first to sixth flexible piezoelectric composites 100, 101, 102, 103, 104, and 105 may be sequentially disposed in the vertical direction. Each of the first to sixth flexible piezoelectric composites 100, 101, 102, 103, 104, and 105 may be substantially the same as the flexible piezoelectric composite described with reference to FIG. 1. The first and second electrodes 110 and 112 may be alternately and repeatedly disposed on the upper surface of the first flexible piezoelectric composite 100, between the first to sixth flexible piezoelectric composites 100, 101, 102, 103, 104, and 105, and on the lower surface of the sixth flexible piezoelectric composite 105.

Each of the first to sixth flexible piezoelectric composites 100, 101, 102, 103, 104, and 105 may have a vertical polarization. Specifically, the polarization directions of the first flexible piezoelectric composites 100 and the second flexible piezoelectric composites 101 may be opposite to each other. The polarization directions of the third and fifth flexible piezoelectric composite 102 and 104 may be the same as that of the first flexible piezoelectric composites 100, and the polarization directions of the fourth and sixth flexible piezoelectric composites 103 and 105 may be the same as that of the second flexible piezoelectric composites 101.

When driving the piezoelectric device, a first driving voltage may be applied to the first electrodes 110, and a second driving voltage may be applied to the second electrodes 112. The first and second driving voltages may be AC voltages which have the same period but have opposite phases.

When driving the piezoelectric device, the relations between the polarization directions and voltage directions of the first to sixth flexible piezoelectric composites 100, 101, 102, 103, 104, and 105 may be the same as each other. Accordingly, when driving the piezoelectric device, the deformation directions of the first to sixth flexible piezoelectric composites 100, 101, 102, 103, 104, and 105 may be the same as each other.

Figure 3G:
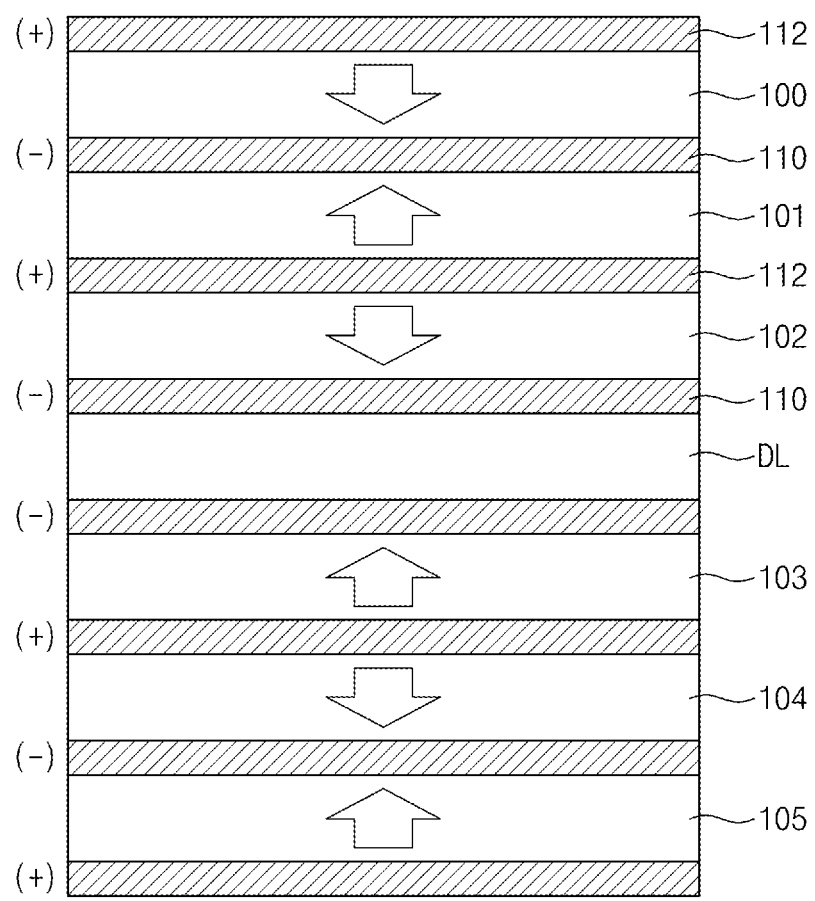

Referring to FIG. 3G, first to sixth flexible piezoelectric composites 100, 101, 102, 103, 104, and 105, first electrodes 110, and second electrodes 112 may be provided. The first to sixth flexible piezoelectric composites 100, 101, 102, 103, 104, and 105 may be sequentially disposed in the vertical direction. Each of the first to sixth flexible piezoelectric composites 100, 101, 102, 103, 104, and 105 may be substantially the same as the flexible piezoelectric composite described with reference to FIG. 1. The dummy composite DL may also be substantially the same as the flexible piezoelectric composite described with reference to FIG. 1. The dummy composite DL may be disposed between the third flexible piezoelectric composite 102 and the fourth flexible piezoelectric composite 103.

The first and second electrodes 110 and 112 may be alternately and repeatedly disposed on the upper surface of the first flexible piezoelectric composite 100, between the first to third flexible piezoelectric composites 100, 101, and 102, and on the lower surface of the third flexible piezoelectric composite 102. Likewise, the first and second electrodes 110 and 112 may be alternately and repeatedly disposed on the upper surface of the fourth flexible piezoelectric composite 103, between the fourth to sixth flexible piezoelectric composites 103, 104, and 105, and on the lower surface of the sixth flexible piezoelectric composite 105. The same kind of electrodes may be disposed between the third flexible piezoelectric composite 102 and the dummy composite DL and between the fourth flexible piezoelectric composite 103 and the dummy composite DL. For example, as illustrated in FIG. 3G, the first electrode 110 may be interposed between the third flexible piezoelectric composite 102 and the dummy composite DL, and the first electrode 110 may also be interposed between the fourth flexible piezoelectric composite 103 and the dummy composite DL.

Each of the first to sixth flexible piezoelectric composites 100, 101, 102, 103, 104, and 105 may have a vertical polarization. Specifically, the polarization directions of the first flexible piezoelectric composites 100 and the second flexible piezoelectric composites 101 may be opposite to each other. The polarization directions of the third and fifth flexible piezoelectric composite 102 and 104 may be the same as that of the first flexible piezoelectric composites 100, and the polarization directions of the fourth and sixth flexible piezoelectric composites 103 and 105 may be the same as that of the second flexible piezoelectric composites 101. The dummy composite DL may not have a polarization.

When driving the piezoelectric device, a first driving voltage may be applied to the first electrodes 110, and a second driving voltage may be applied to the second electrodes 112. The first and second driving voltages may be AC voltages which have the same period but have opposite phases.

When driving the piezoelectric device, the relations between the polarization directions and voltage directions of the first to sixth flexible piezoelectric composites 100, 101, 102, 103, 104, and 105 may be the same as each other. Accordingly, when driving the piezoelectric device, the deformation directions of the first to sixth flexible piezoelectric composites 100, 101, 102, 103, 104, and 105 may be the same as each other.

Figure 3H:
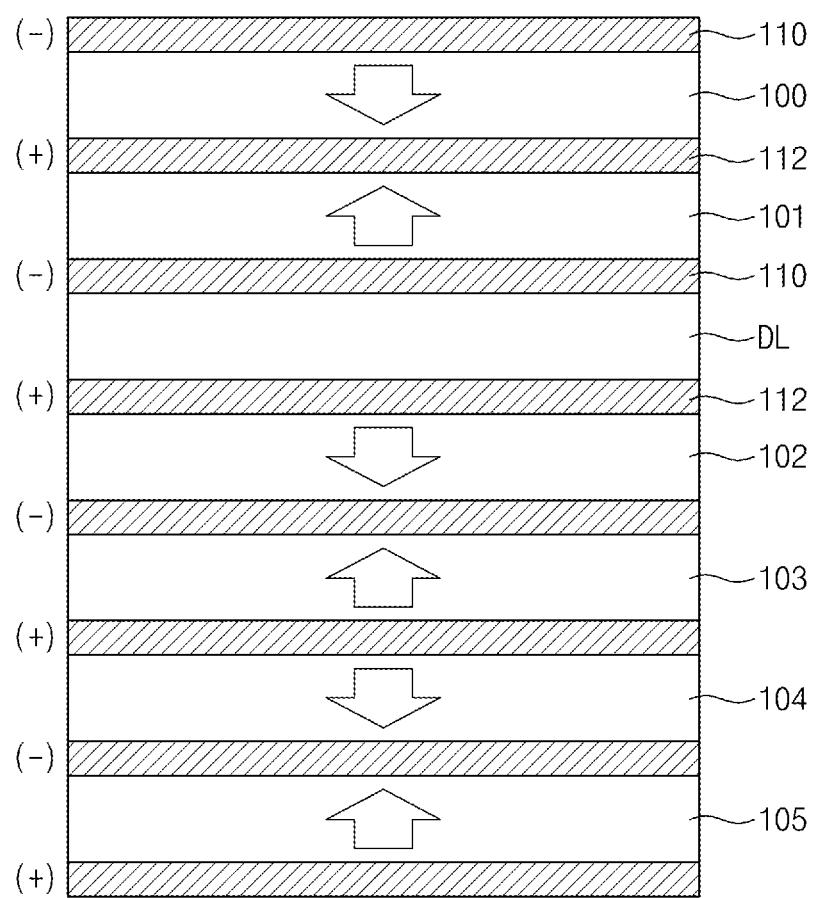

Referring to FIG. 3H, first to sixth flexible piezoelectric composites 100, 101, 102, 103, 104, and 105, a dummy composite DL, first electrodes 110, and second electrodes 112 may be provided. The first to sixth flexible piezoelectric composites 100, 101, 102, 103, 104, and 105 may be sequentially disposed in the vertical direction. Each of the first to sixth flexible piezoelectric composites 100, 101, 102, 103, 104, and 105 may be substantially the same as the flexible piezoelectric composite described with reference to FIG. 1. The dummy composite DL may also be substantially the same as the flexible piezoelectric composite described with reference to FIG. 1. The dummy composite DL may be disposed between the second flexible piezoelectric composite 101 and the third flexible piezoelectric composite 102.

The first and second electrodes 110 and 112 may be alternately and repeatedly disposed on the upper surface of the first flexible piezoelectric composite 100, between the first and second flexible piezoelectric composites 100 and 101, between the second flexible piezoelectric composites 101 and dummy composite DL, between the dummy composite DL and the third flexible piezoelectric composite 102, between the third to sixth flexible piezoelectric composites 102, 103, 104, and 105, and on the lower surface of the sixth flexible piezoelectric composites 105.

Each of the first to sixth flexible piezoelectric composites 100, 101, 102, 103, 104, and 105 may have a vertical polarization. Specifically, the polarization directions of the first flexible piezoelectric composites 100 and the second flexible piezoelectric composites 101 may be opposite to each other. The polarization directions of the third and fifth flexible piezoelectric composite 102 and 104 may be the same as that of the first flexible piezoelectric composites 100, and the polarization directions of the fourth and sixth flexible piezoelectric composites 103 and 105 may be the same as that of the second flexible piezoelectric composites 101. The dummy composite DL may not have a polarization.

When driving the piezoelectric device, a first driving voltage may be applied to the first electrodes 110, and a second driving voltage may be applied to the second electrodes 112. The first and second driving voltages may be AC voltages which have the same period but have opposite phases.

When driving the piezoelectric device, the relations between the polarization directions and voltage directions of the first and second flexible piezoelectric composites 100 and 101 may be the same as each other, and the relations between the polarization directions and voltage directions of the third to sixth flexible piezoelectric composites 102, 103, 104, and 105 may be the same as each other. The relations between the polarization directions and voltage directions of the first flexible piezoelectric composite 100 and between the polarization directions and voltage directions of the third flexible piezoelectric composite 102 may be opposite to each other. Accordingly, as described with reference to FIG. 3C, the deformation directions of the first and second flexible piezoelectric composites 100 and 101 and the deformation directions of the third to sixth flexible piezoelectric composites 102, 103, 104, and 105 may be opposite to each other.

Figure 4A:
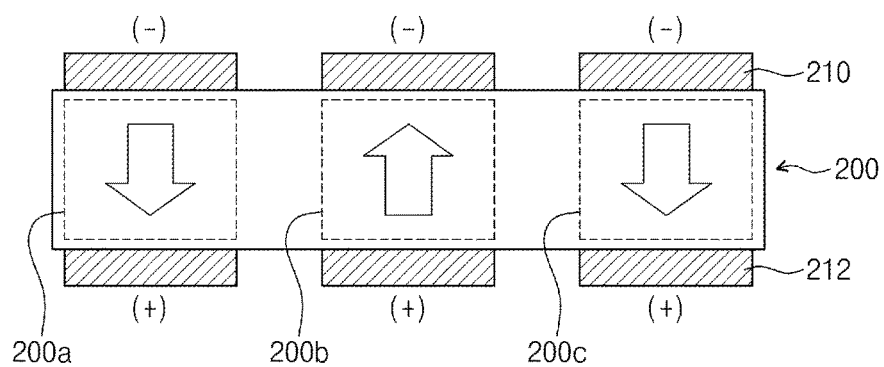
FIGS. 4A and 4B are cross-sectional views illustrating piezoelectric devices according to embodiments of the inventive concept.
Figure 4B:
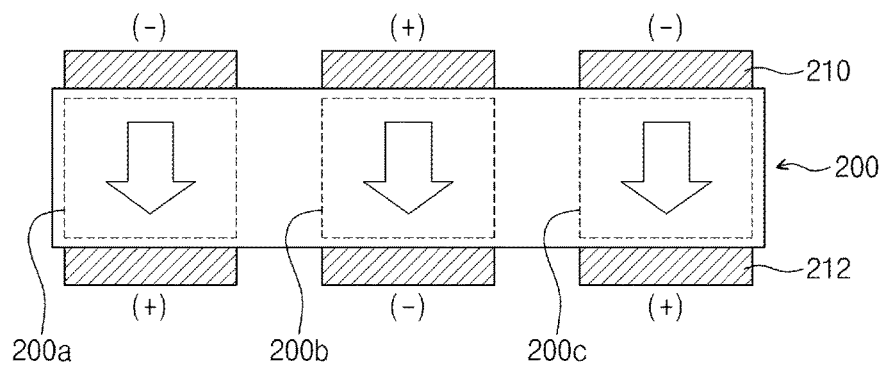

FIGS. 4A and 4B are cross-sectional views illustrating piezoelectric devices according to embodiments of the inventive concept.

Referring to FIG. 4A, a flexible piezoelectric composite 200 may be provided. The flexible piezoelectric composite 200 may be substantially the same as the flexible piezoelectric composite described with reference to FIG. 1. Electrodes 210 and 212 may be provided to upper and lower surfaces of the flexible piezoelectric composite 200.

The flexible piezoelectric composite 200 may include first to third polarization regions 200a, 200b, and 200c which are arranged in the horizontal direction. The second polarization region 200b may be located at a central portion of the flexible piezoelectric composite 200, and the first and third polarization regions 200a and 200c may be located at peripheral portions on both sides of the second polarization regions 200b.

Each of the polarization regions 200a, 200b, and 200c may have a vertical polarization. The first and third polarization regions 200a and 200c may have the same polarization direction. The second polarization regions 200b may have polarization having a direction opposite the polarization directions of the first and third polarization regions 200a and 200c.

The first electrodes 210 may be respectively disposed on the polarization regions 200a, 200b, and 200c, and the second electrodes 212 may be respectively disposed under the polarization regions 200a, 200b, and 200c.

When driving the piezoelectric device, a first driving voltage may be applied to the first electrodes 210, and a second driving voltage may be applied to the second electrodes 212. The first and second driving voltages may be AC voltages which have the same period but have opposite phases.

When driving the piezoelectric device, the relations between the polarization directions and voltage directions of the first and third polarization regions 200*a* and 200*c* may be the same as each other. The relation between the polarization directions and voltage directions of the second polarization regions 200*b* may be opposite the relations between the polarization directions and voltage directions of the first and third polarization regions 200*a* and 200*c*. Accordingly, when the first and third polarization regions 200*a* and 200*c* are expanded in the vertical direction, the second polarization region 200*b* may be contracted in the vertical direction. On the contrary, when the first and third polarization regions 200*a* and 200*c* are contracted in the vertical direction, the second polarization region 200*b* may be expanded in the vertical direction. Consequently, when driving the piezoelectric device, the flexible piezoelectric composite may be curvedly deformed in the horizontal direction.

Referring to FIG. 4B, a flexible piezoelectric composite 200 may be provided. The flexible piezoelectric composite 200 may be substantially the same as the flexible piezoelectric composite described with reference to FIG. 1. Electrodes 210 and 212 may be provided to upper and lower surfaces of the flexible piezoelectric composite 200.

The flexible piezoelectric composite 200 may include first to third polarization regions 200*a*, 200*b*, and 200*c* which are arranged in the horizontal direction. The second polarization region 200*b* may be located at a central portion of the flexible piezoelectric composite 200, and the first and third polarization regions 200*a* and 200*c* may be located at peripheral portions on both sides of the flexible piezoelectric composite 200.

Each of the polarization regions 200*a*, 200*b*, and 200*c* may have a vertical polarization. The first to third polarization regions 200*a*, 200*b*, and 200*c* may have the same polarization direction.

The first electrodes 210 may be respectively disposed on the first polarization region 200*a*, under the second polarization region 200*b*, and on the third polarization region 200*c*. The second electrodes 212 may be respectively disposed under the first polarization region 200*a*, on the second polarization region 200*b*, and under the third polarization region 200*c*.

When driving the piezoelectric device, a first driving voltage may be applied to the first electrodes 210, and a second driving voltage may be applied to the second electrodes 212. The first and second driving voltages may be AC voltages which have the same period but have opposite phases.

When driving the piezoelectric device, the relations between the polarization directions and voltage directions of the first and third polarization regions 200*a* and 200*c* may be the same as each other. The relation between the polarization directions and voltage directions of the second polarization regions 200*b* may be opposite the relations between the polarization directions and voltage directions of the first and third polarization regions 200*a* and 200*c*. Accordingly, when the first and third polarization regions 200*a* and 200*c* are expanded in the vertical direction, the second polarization region 200*b* may be contracted in the vertical direction. On the contrary, when the first and third polarization regions 200*a* and 200*c* are contracted in the vertical direction, the second polarization region 200*b* may be expanded in the vertical direction. Consequently, when driving the piezoelectric device, the flexible piezoelectric composite may be curvedly deformed in the horizontal direction.

FIGS. 5A to 5D are cross-sectional views illustrating a piezoelectric devices according to embodiments of the inventive concept.

Figure 5A:
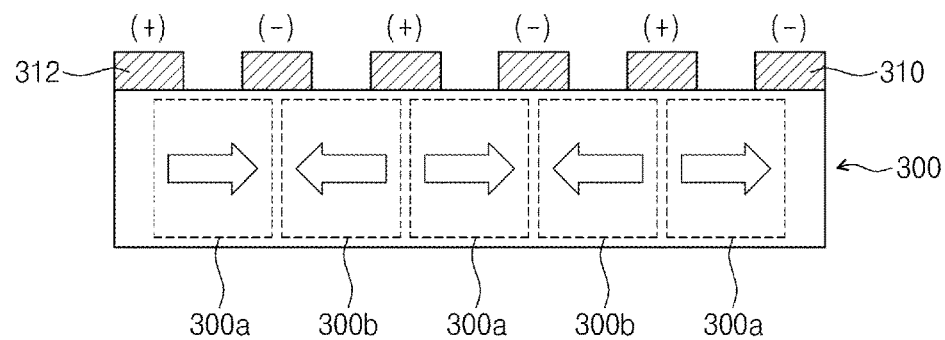
FIGS. 5A to 5D are cross-sectional views illustrating piezoelectric devices according to embodiments of the inventive concept.

Referring to FIG. 5A, a flexible piezoelectric composite 300 may be provided. The flexible piezoelectric composite 300 may be substantially the same as the flexible piezoelectric composite described with reference to FIG. 1. Electrodes 310 and 312 may be provided to the upper surface of the flexible piezoelectric composite 300.

The flexible piezoelectric composite 300 may include a first polarization region 300*a* and a second polarization region 300*b* which are sequentially and alternately arranged in the horizontal direction. Each of the first and second polarization regions 300*a* and 300*b* may have a horizontal polarization. The polarization direction of the first polarization region 300*a* may be opposite the polarization direction of the second polarization region 300*b*.

The first and second electrodes 310 and 312 may be sequentially and alternately disposed on the upper surface of the flexible piezoelectric composite 300. The first and second electrodes 310 and 312 may be spaced apart from each other, and may vertically overlap borders between the first and second polarization regions 300*a* and 300*b* which are adjacent to each other.

When driving the piezoelectric device, a first driving voltage may be applied to the first electrodes 310, and a second driving voltage may be applied to the second electrodes 312. The first and second driving voltages may be AC voltages which have the same period but have opposite phases.

When driving the piezoelectric device, the relation between the polarization directions and voltage directions of the first polarization regions 300*a* may be the same as the relation between the polarization directions and voltage directions of the second polarization regions 300*b*. Accordingly, when the first polarization regions 300*a* are expanded in the horizontal direction, the second polarization region 300*b* may also be expanded in the horizontal direction. When the first polarization regions 300*a* are contracted in the horizontal direction, the second polarization region 300*b* may also be contracted in the horizontal direction.

Figure 5B:
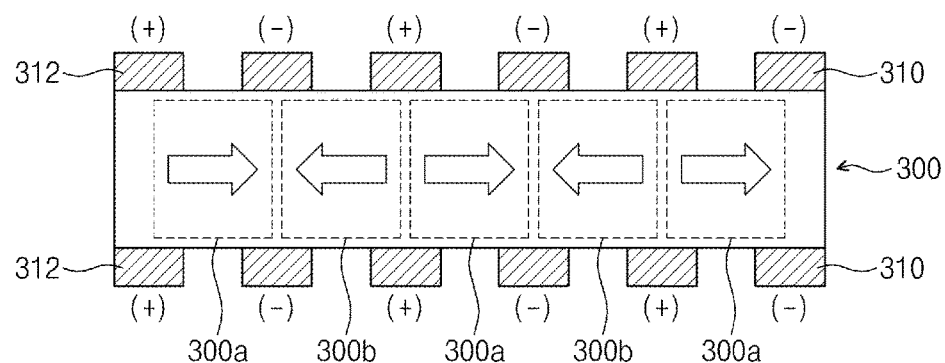

Referring to FIG. 5B, a flexible piezoelectric composite 300 may be provided. The flexible piezoelectric composite 300 may be substantially the same as described with reference to FIG. 5A. Electrodes 310 and 312 may be provided to upper and lower surfaces of the flexible piezoelectric composite 300. The first and second electrodes 310 and 312 disposed on the upper surface of the flexible piezoelectric composite 300 may be substantially the same as described with reference to FIG. 5A. For simplification of description, descriptions on the same configuration as described with reference to FIG. 5A will not be provided.

The first and second electrodes 310 and 312 may be disposed on the lower surface of the flexible piezoelectric composite 300 so as to correspond to the first and second electrodes 310 and 312 disposed on the upper surface of the flexible piezoelectric composite 300. Accordingly, when driving the piezoelectric device, the deformation of the flexible piezoelectric composite 300 may be the same as described with reference to FIG. 5A.

Figure 5C:
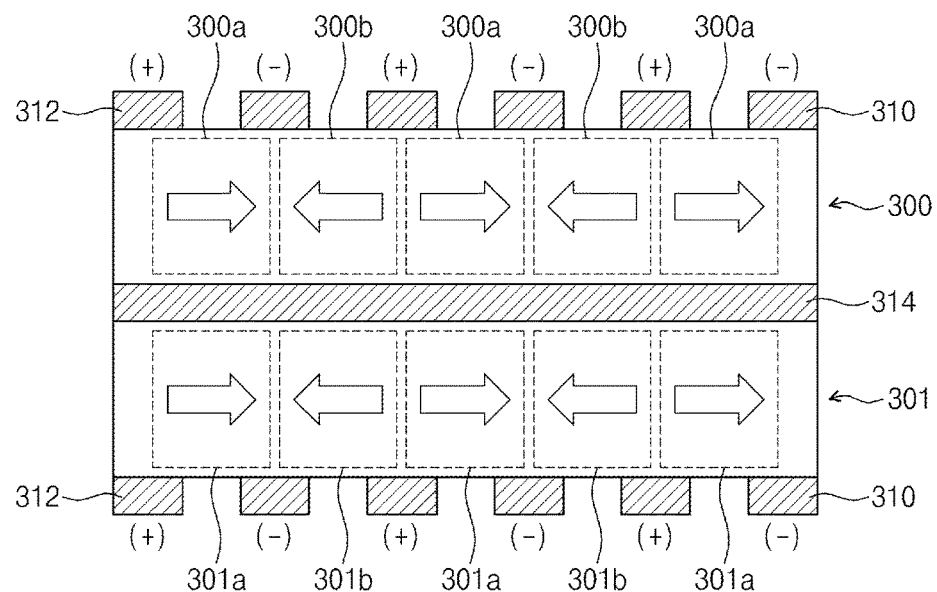

Referring to FIG. 5C, first and second flexible piezoelectric composites 300 and 301 may be provided. The first flexible piezoelectric composite 300 may be disposed on the second flexible piezoelectric composite 301. First and second electrodes 310 and 312 may be disposed on the upper surface of the first flexible piezoelectric composites 300 and on the lower surface of the second flexible piezoelectric composites 301. The third electrode 314 may be provided between the first and second flexible piezoelectric composites 300 and 301.

The first flexible piezoelectric composite 300, and the first and second electrodes 310 and 312 disposed on the upper surfaces of the first flexible piezoelectric composite 300 may be substantially the same as described with reference to FIG. 5A. For simplification of description, descriptions on the same configuration as described with reference to FIG. 5A will not be provided.

The second flexible piezoelectric composite 301 may include a third polarization region 301a and a fourth polarization region 301b which are sequentially and alternately arranged in the horizontal direction. Each of the third and fourth polarization regions 301a and 301b may have a horizontal polarization. The polarization direction of the third polarization regions 301a may be opposite the polarization direction of the fourth polarization regions 301b.

The polarization direction of the third polarization regions 301a may be the same as the polarization direction of the first polarization regions 300a. Also, the third polarization regions 301a may be disposed to vertically correspond to the first polarization regions 300a.

The polarization direction of the fourth polarization region 301b may be the same as the polarization direction of the second polarization region 300b. Also, the fourth polarization regions 301b may be disposed to vertically correspond to the second polarization regions 300b.

The first and second electrodes 310 and 312 may be sequentially and alternately disposed on the lower surface of the second flexible piezoelectric composite 301. The first and second electrodes 310 and 312 may be spaced apart from each other, and may vertically overlap a border between the third and fourth polarization regions 301a and 301b which are adjacent to each other. Furthermore, the first electrodes 310 disposed on the lower surface of the second flexible piezoelectric composite 301 may vertically correspond to the first electrodes 310 disposed on the upper surface of the first flexible piezoelectric composite 300, and the second electrodes 312 disposed on the lower surface of the second flexible piezoelectric composite 301 may vertically correspond to the second electrodes 312 disposed on the upper surface of the first flexible piezoelectric composite 300.

When driving the piezoelectric device, a first driving voltage may be applied to the first electrodes 310, and a second driving voltage may be applied to the second electrodes 312. The first and second driving voltages may be AC voltages which have the same period but have opposite phases.

When driving the piezoelectric device, the relations between the polarization directions and voltage directions of the first to fourth polarization regions 300a, 300b, 301a, and 301b may be the same as each other. Accordingly, when the first polarization regions 300a are expanded in the horizontal direction, the second to fourth polarization regions 300b, 301a, and 301b may also be expanded in the horizontal direction. When the first polarization regions 300a are contracted in the horizontal direction, the second to fourth polarization regions 300b, 301a, and 301b may also be contracted in the horizontal direction.

Figure 5D:
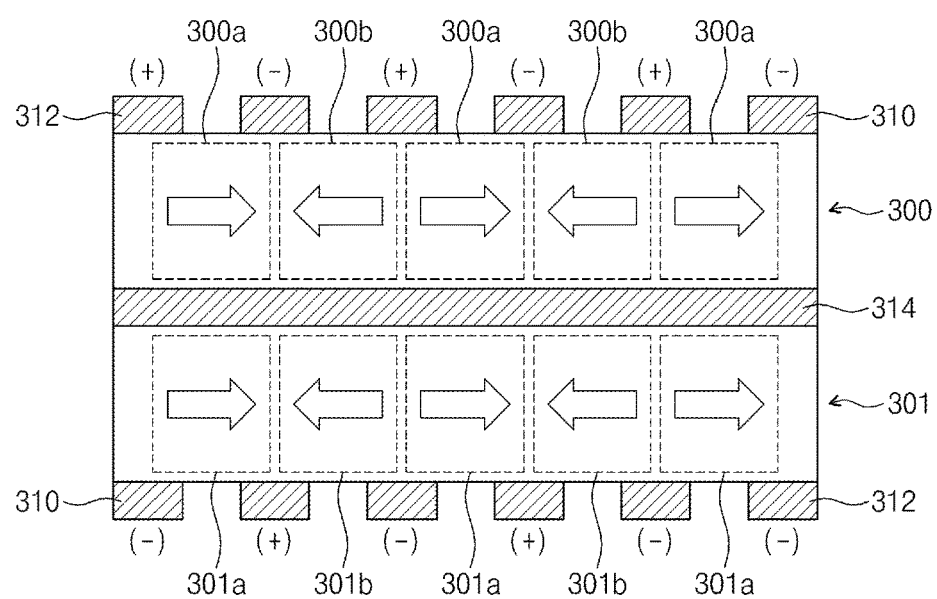

Referring to FIG. 5D, first and second flexible piezoelectric composites 300 and 301 may be provided. The first flexible piezoelectric composite 300 may be disposed on the second flexible piezoelectric composite 301. First and second electrodes 310 and 312 may be provided on the upper surface of the first flexible piezoelectric composites 300 and on the lower surface of the second flexible piezoelectric composites 301. A third electrode 314 may be provided between the first and second flexible piezoelectric composites 300 and 301.

The first and second flexible piezoelectric composites 300 and 301, and the first and second electrodes 310 and 312 disposed on the upper surface of the first flexible piezoelectric composite 300 may be substantially the same as described with reference to FIG. 5C. For simplification of description, descriptions on the same configuration as described with reference to FIG. 5C will not be provided.

The first and second electrodes 310 and 312 may be sequentially and alternately disposed on the lower surface of the second flexible piezoelectric composite 301. The first and second electrodes 310 and 312 may be spaced apart from each other, and may vertically overlap borders between the third and fourth polarization regions 301a and 301b which are adjacent to each other. Furthermore, the first electrodes 310 disposed on the lower surface of the second flexible piezoelectric composite 301 may vertically correspond to the second electrodes 312 disposed on the upper surface of the first flexible piezoelectric composite 300, and the second electrodes 312 disposed on the lower surface of the second flexible piezoelectric composite 301 may vertically correspond to the first electrodes 310 disposed on the upper surface of the first flexible piezoelectric composite 300.

When driving the piezoelectric device, a first driving voltage may be applied to the first electrodes 310, and a second driving voltage may be applied to the second electrodes 312. The first and second driving voltages may be AC voltages which have the same period but have opposite phases.

When driving the piezoelectric device, the relations between the polarization directions and voltage directions of the first and second polarization regions 300a and 300b may be the same as each other. Also, the relations between the polarization directions and voltage directions of the third and fourth polarization regions 301a and 301b may be the same as each other. However, the relation between the polarization directions and voltage directions of the first polarization regions 300a and the relation between the polarization directions and voltage directions of the third polarization regions 301a may be opposite to each other. Accordingly, when the first and second polarization regions 300a and 300b are expanded in the horizontal direction, the second and fourth polarization regions 301a and 301b may be contracted in the horizontal direction. On the contrary, when the first and second polarization regions 300a and 300b are contracted in the horizontal direction, the second and fourth polarization regions 301a and 301b may be expanded in the horizontal direction. In other words, when the first flexible piezoelectric composite 300 is contracted in the horizontal direction, the second flexible piezoelectric composite 301 may be expanded in the horizontal direction, and when the first flexible piezoelectric composite 300 is expanded in the horizontal direction, the second flexible piezoelectric composite 301 may be contracted in the horizontal direction. Consequently, when driving the piezoelectric device, the first and second flexible piezoelectric composites 300 and 301 may be curved in the vertical direction.

Figure 6A:
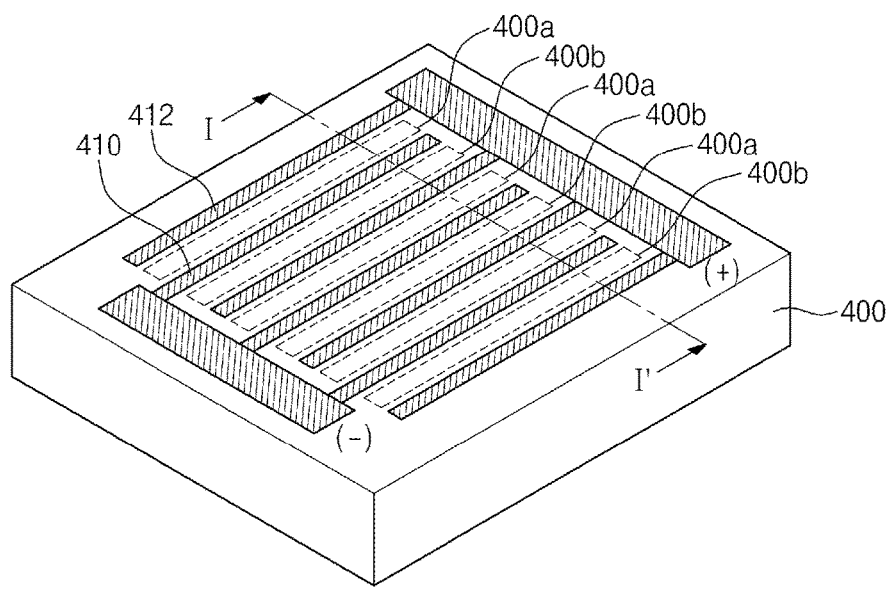
FIG. 6A is a perspective view of a piezoelectric device according to embodiments of the inventive concept.
Figure 6B:
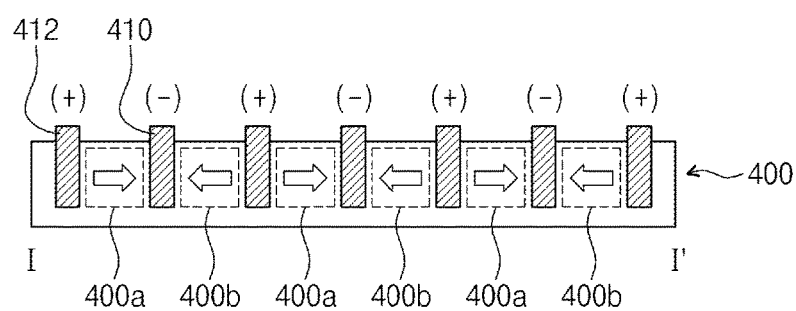
FIG. 6B is a cross-sectional view taken along line I-I' of FIG. 6A.

FIG. 6 illustrates a piezoelectric device according to embodiments of the inventive concept. Specifically, FIG. 6A is a perspective view of a piezoelectric device according to embodiments of the inventive concept, and FIG. 6B is a cross-sectional view taken along line I-I' of FIG. 6A.

Referring to FIG. 6, a flexible piezoelectric composite 400 may be provided. The flexible piezoelectric composite 400 may be substantially the same as the flexible piezoelectric composite described with reference to FIG. 1. First and second electrodes 410 and 412 may be provided in the flexible piezoelectric composite 400.

The flexible piezoelectric composite 400 may include first polarization regions 400a and second polarization regions 400b which are sequentially and alternately arranged in the horizontal direction. Each of the first and second polarization regions 400a and 400b may have a horizontal polarization. The polarization direction of the first polarization region 400a may be opposite the polarization direction of the second polarization region 400b.

The first and second electrodes 410 and 412 may be disposed to be inserted between the polarization regions 400a and 400b. Furthermore, the first and second electrodes 410 and 412 may be sequentially and alternately arranged in the horizontal direction. For example, the first polarization region 400a, the first electrode 410, the second polarization region 400b, and the second electrodes 412 may be sequentially and alternately arranged in the horizontal direction.

When driving the piezoelectric device, a first driving voltage may be applied to the first electrodes 410, and a second driving voltage may be applied to the second electrodes 412. The first and second driving voltages may be AC voltages which have the same period but have opposite phases.

When driving the piezoelectric device, the relations between the polarization directions and voltage directions of the first polarization regions 400a may be the same as the relations between the polarization directions and voltage directions of the second polarization regions 400b. Accordingly, when the first polarization regions 400a is expanded in the horizontal direction, the second polarization region 400b may also be expanded in the horizontal direction. When the first polarization regions 400a are contracted in the horizontal direction, the second polarization region 400b may also be contracted in the horizontal direction.

Figure 7A:
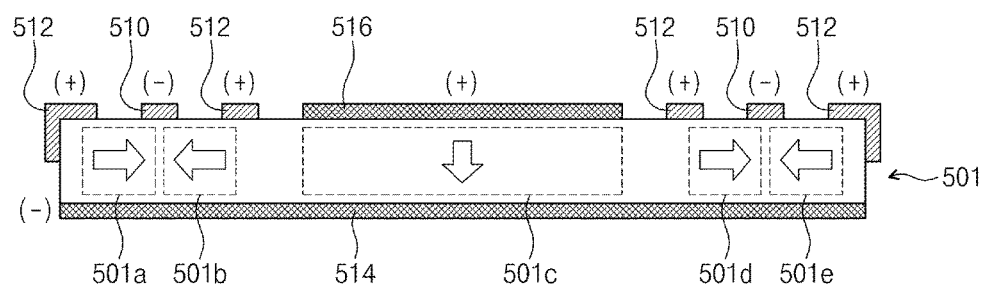
FIGS. 7A to 7C are cross-sectional views illustrating piezoelectric devices according to embodiments of the inventive concept.
Figure 7B:
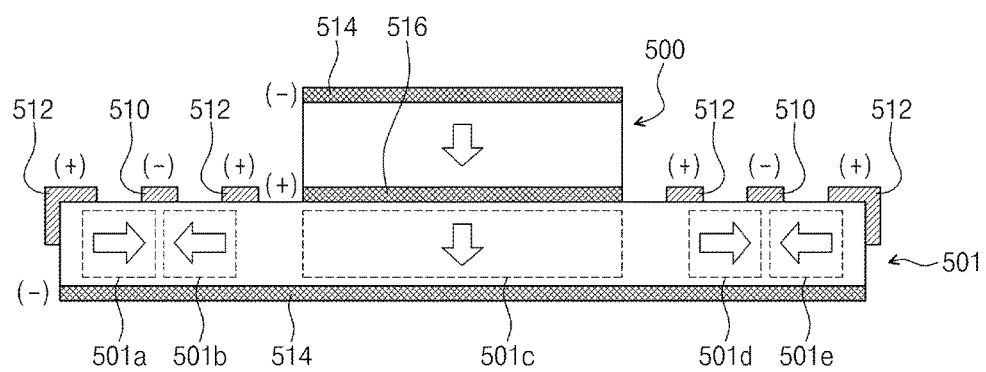
Figure 7C:
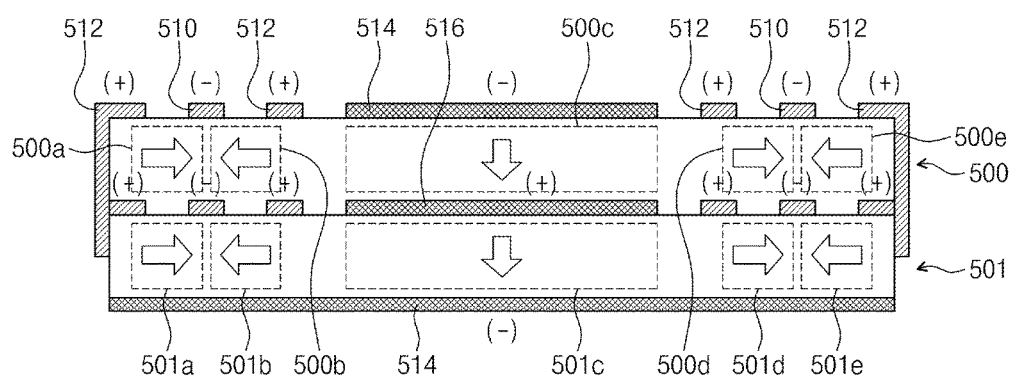

FIGS. 7A to 7C are cross-sectional views illustrating piezoelectric devices according to embodiments of the inventive concept.

Referring to FIG. 7A, a flexible piezoelectric composite 501 may be provided. The flexible piezoelectric composite 501 may be substantially the same as the flexible piezoelectric composite described with reference to FIG. 1. Electrodes 510, 512, 514, and 516 may be provided to upper and lower surfaces of the flexible piezoelectric composite 501.

The flexible piezoelectric composite 501 may include first to fifth polarization regions 501a to 501e which are sequentially arranged in the horizontal direction. The third polarization region 501c may be located at a central portion of the flexible piezoelectric composite 501. The first and second polarization regions 501a and 501b may be located at one side of the third polarization region 501c, and the fourth and fifth polarization regions 501d and 501e may be located at the other side of the third polarization region 501c. Specifically, the first and fifth polarization regions 501a and 501e may be located at peripheral portions of the flexible piezoelectric composite 501. The second polarization regions 501b may be located between the first and third polarization regions 501a and 501c, and the fourth polarization regions 501d may be located between the third and fifth polarization regions 501c and 501e.

Each of the first, second, fourth, and fifth polarization regions 501a, 501b, 501d, and 501e may have a horizontal polarization. The polarization direction of the first polarization region 501a and the polarization direction of the fourth polarization region 501d may be the same as each other, and the polarization direction of the second polarization region 501b and the polarization direction of the fifth polarization region 501e may be the same as each other. The polarization direction of the first polarization region 501a and the polarization direction of the second polarization region 501b may be opposite to each other, and likewise, the polarization direction of the fourth polarization region 501d and the polarization direction of the fifth polarization region 501e may be opposite to each other. The third polarization region 501c may have a vertical polarization.

A third electrode 514 may be disposed on the lower surface of the flexible piezoelectric composite 501. The third electrode 514 may be located to vertically overlap the third polarization region 501c. According to an embodiment, as illustrated in FIG. 7A, the third electrode 514 may extend to vertically overlap the first, second, fourth, and fifth polarization regions 501a, 501b, 501d, and 501e.

A fourth electrode 516 may be disposed on the upper surface of the flexible piezoelectric composite 501. The fourth electrode 516 may be located to vertically overlap the third polarization region 501c. The fourth electrode 516 may not vertically overlap the first, second, fourth, and fifth polarization regions 501a, 501b, 501d, and 501e.

The first electrodes 510 may be disposed on the upper surface of the flexible piezoelectric composite 501. Specifically, any one of the first electrodes 510 may be located to vertically overlap a border between the first and second regions 501a and 501b, and the other one may be located to vertically overlap a border between the fourth and fifth regions 501d and 501e.

The second electrodes 512 may be disposed on the upper surface of the flexible piezoelectric composite 501. Specifically, any two of the second electrodes 512 may be disposed between each of the first electrodes 510 and the fourth electrode 516. Also, the other two of the second electrodes 512 may be disposed on both end portions of the flexible piezoelectric composite 501. According to an embodiment, the second electrodes 512 disposed on both end portions of the flexible piezoelectric composite 501 may respectively extend to both side walls of the flexible piezoelectric composite 501. The electrodes 510, 512, and 516 disposed on the upper surface of the flexible piezoelectric composite 501 may be spaced apart from each other.

When driving the piezoelectric device, a first driving voltage may be applied to the first electrodes 510, and a second driving voltage may be applied to the second electrodes 512. The first and second driving voltages may be AC voltages which have the same period but have opposite phases. Also, when driving the piezoelectric device, a third driving voltage may be applied to the third electrode 514, and a fourth driving voltage may be applied to the fourth electrode 516. The third and fourth driving voltages may be AC voltages which have the same period but have opposite phases. According to several embodiments, the periods of the first and second driving voltages and the periods of the third and fourth driving voltages may be different from each other. For example, the periods of the first and second driving voltages may be shorter than the periods of the third and fourth driving voltages.

When driving the piezoelectric device, the first, second, fourth, and fifth polarization regions 501a, 501b, 501d, and 501e may be affected by the first and second driving voltages applied to the first and second electrodes 510 and 512. The relations between the polarization directions and the voltage directions of the first, second, fourth, and fifth polarization regions 501a, 501b, 501d, and 501e may be the same as each other. Accordingly, when the first polarization region 501a is expanded in the horizontal direction, the second, fourth, and fifth polarization regions 501b, 501d, and 501e may also be expanded in the horizontal direction. When the first polarization region 501a is contracted in the horizontal direction, the second, fourth, and fifth polarization regions 501b, 501d, and 501e may also be contracted in the horizontal direction.

When driving the piezoelectric device, the third polarization region 501c may be affected by the third and fourth driving voltages applied to the third and fourth electrodes 514 and 516. The third polarization region 501c may repeat contraction and expansion in the vertical direction.

Referring to FIG. 7B, first and second flexible piezoelectric composites 500 and 501 may be provided. The first flexible piezoelectric composite 500 may be disposed on the second flexible piezoelectric composite 501.

The second flexible piezoelectric composites 501, and electrodes 510, 512, 514, and 516 disposed on the upper and lower surfaces of the second flexible piezoelectric composites 501 may be substantially the same as the flexible piezoelectric composite and the electrodes which are described with reference to FIG. 7A. For simplification of description, descriptions on the same configuration as described with reference to FIG. 7A will not be provided.

The first flexible piezoelectric composite 500 may be disposed on the fourth electrode 516. Accordingly, the fourth electrode may be interposed between the first and second flexible piezoelectric composites 500 and 501. The first flexible piezoelectric composite 500 may have a vertical polarization. Specifically, the polarization directions of the first flexible piezoelectric composite 500 and the third polarization region 501c may be the same as each other.

The third electrode 514 may further be disposed on the upper surface of the first flexible piezoelectric composite 500.

When driving the piezoelectric device, a first driving voltage may be applied to the first electrodes 510, and a second driving voltage may be applied to the second electrodes 512. The first and second driving voltages may be AC voltages which have the same period but have opposite phases. Also, a third driving voltage may be applied to the third electrode 514, and a fourth driving voltage may be applied to the fourth electrodes 516. The third and fourth driving voltages may be AC voltages which have the same period but have opposite phases. According to several embodiments, the periods of the first and second driving voltages and the periods of the third and fourth driving voltages may be different from each other. For example, the periods of the first and second driving voltages may be shorter than the periods of the third and fourth driving voltages.

When driving the piezoelectric device, the first, second, fourth, and fifth polarization regions 501a, 501b, 501d, and 501e may be affected by the first and second driving voltages applied to the first and second electrodes 510 and 512. The relations between the polarization directions and the voltage directions of the first, second, fourth, and fifth polarization regions 501a, 501b, 501d, and 501e may be the same as each other. Accordingly, when the first polarization region 501a is expanded in the horizontal direction, the second, fourth, and fifth polarization regions 501b, 501d, and 501e may also be expanded in the horizontal direction. When the first polarization region 501a is contracted in the horizontal direction, the second, fourth, and fifth polarization regions 501b, 501d, and 501e may also be contracted in the horizontal direction.

When driving the piezoelectric device, the first flexible piezoelectric composites 500 and the third polarization region 501c may be affected by the third and fourth driving voltages applied to the third and fourth electrodes 514 and 516. The relation between the polarization directions and voltage directions of the first flexible piezoelectric composite 500 and the relation between the polarization directions and voltage directions of the third polarization region 501c may be opposite to each other. Accordingly, when the first flexible piezoelectric composite 500 is expanded in the vertical direction, the third polarization regions 501c may be contracted in the vertical direction. When the first flexible piezoelectric composite 500 is contracted in the vertical direction, the third polarization regions 501c may be expanded in the vertical direction.

Referring to FIG. 7C, first and second flexible piezoelectric composites 500 and 501 may be provided. The first flexible piezoelectric composite 500 may be disposed on the second flexible piezoelectric composite 501. The first flexible piezoelectric composite 500 and the second flexible piezoelectric composite 501 may have substantially the same width in the horizontal direction.

The second flexible piezoelectric composite 501, and electrodes 510, 512, 514, and 516 disposed on the upper and lower surfaces of the second flexible piezoelectric composites 501 may be substantially the same as the flexible piezoelectric composite and the electrodes which are described with reference to FIG. 7A. For simplification of description, descriptions on the same configuration as described with reference to FIG. 7A will not be provided.

The first flexible piezoelectric composite 500 may include sixth to 10th polarization regions 500a to 500e which are sequentially arranged in the horizontal direction. The eighth polarization region 500c may be located at a central portion of the flexible piezoelectric composite 500. The sixth and seventh polarization regions 500a and 500b may be located at one side of the eighth polarization region 501c, and the ninth and 10th polarization regions 501d and 501e may be located at the other side of the eighth polarization region 501c. Specifically, the sixth to 10th polarization regions 500a to 500e may vertically overlap the first to fifth polarization regions 501a to 501e.

Each of the sixth, seventh, ninth, and 10th polarization regions 500a, 500b, 500d, and 500e may have a horizontal polarization. The eighth polarization region 500c may have a vertical polarization. Specifically, the polarization directions of the sixth to 10th polarization regions 500a to 500e may be respectively the same as the polarization directions of the first to fifth polarization regions 501a to 501e.

The electrode 510, 512 and 514 may be disposed on the upper surface of the first flexible piezoelectric composite 500. Specifically, the first and second electrodes 510 and 512 may be disposed on the upper surface of the first flexible piezoelectric composite 500 so as to correspond to the first and second electrodes 510 and 512 disposed on the upper surface of the second flexible piezoelectric composite 501. A third electrode 514 may be disposed on the upper surface of the eighth polarization region 500c so as to correspond to the fourth electrode 516.

When driving the piezoelectric device, a first driving voltage may be applied to the first electrodes 510, and a second driving voltage may be applied to the second electrodes 512. The first and second driving voltages may be AC voltages which have the same period but have opposite phases. Also, a third driving voltage may be applied to the third electrode 514, and a fourth driving voltage may be applied to the fourth electrodes 516. The third and fourth driving voltages may be AC voltages which have the same period but have opposite phases. According to several embodiments, the periods of the first and second driving voltages and the periods of the third and fourth driving voltages may be different from each other. For example, the periods of the first and second driving voltages may be shorter than the periods of the third and fourth driving voltages.

When driving the piezoelectric device, the first, second, fourth, fifth, sixth, seventh, ninth, and 10th polarization regions 501a, 501b, 501d, 501e, 500a, 500b, 500d, and 500e may be affected by the first and second driving voltages applied to the first and second electrodes 510 and 512. The relations between the polarization directions and the voltage directions of the first, second, fourth, fifth, sixth, seventh, ninth, and 10th polarization regions 501a, 501b, 501d, 501e, 500a, 500b, 500d, and 500e may be the same as each other. Accordingly, when the first polarization region 501a is expanded in the horizontal direction, the second, fourth, fifth, sixth, seventh, ninth, and 10th polarization regions 501b, 501d, 501e, 500a, 500b, 500d, and 500e may also be expanded in the horizontal direction. When the first polarization region 501a is contracted in the horizontal direction, the second, fourth, fifth, sixth, seventh, ninth, and 10th polarization regions 501b, 501d, 501e, 500a, 500b, 500d, and 500e may also be contracted in the horizontal direction.

When driving the piezoelectric device, the third polarization region 501c and the eighth polarization region 500c may be affected by the third and fourth driving voltages applied to the third and fourth electrodes 514 and 516. The relation between the polarization directions and voltage directions of the eighth polarization region 500c may be opposite the relation between the polarization directions and voltage directions of the third polarization region 501c. Accordingly, when the eighth polarization region 500c is expanded in the vertical direction, the third polarization region 501c is contracted in the vertical direction. When the eighth polarization region 500c is contracted in the vertical direction, the third polarization region 501c is expanded in the vertical direction.

According to embodiments of the inventive concept, a flexible piezoelectric composite may include a polymer matrix including first and second polymers which have flexibility different from each other. Thus, the flexible piezoelectric composite may have improved flexibility and improved resistant force against inner fatigue fracture.

According to embodiments of the inventive concept, the flexible piezoelectric composite may include conductive nanostructures. Thus, even piezoelectric particles located relatively farther from electrodes (that is, located at a central portion of the polymer matrix) may be effectively polarized.

The above-disclosed subject matter is to be considered illustrative and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description. Therefore, the above-described embodiments are illustrative in all the aspects, and should be construed as not being limitative.

What is claimed is:

1. A flexible piezoelectric composite comprising:
   a matrix including first and second polymers, the first polymer having Young's modulus different from Young's modulus of the second polymer;
   piezoelectric particles disposed in the matrix; and
   a conductive nanostructure disposed in the matrix.

2. The flexible piezoelectric composite of claim 1, wherein the Young's modulus of the first polymer is equal to or greater than about 10 times the Young's modulus of the second polymer.

3. The flexible piezoelectric composite of claim 2, wherein the first polymer is a bisphenol-F epoxy, and the second polymer is a bisphenol-A epoxy.

4. The flexible piezoelectric composite of claim 1, wherein the conductive nanostructure has a bar shape having a longitudinal axis in one direction.

5. The flexible piezoelectric composite of claim 3, wherein the conductive nanostructure comprises at least one of carbon nanotubes, graphene, silver nanowires, or metal flakes.

6. The flexible piezoelectric composite of claim 1, wherein the conductive nanostructure comprises carbon nanotubes, and the content of the conductive nanostructure is about 0.1 wt % or less.

7. The flexible piezoelectric composite of claim 6, wherein the content of the conductive nanostructure is about 0.03 wt % to about 0.08 wt %.

8. The flexible piezoelectric composite of claim 1, wherein the content of piezoelectric particles is about 50 wt % to about 90 wt %.

* * * * *